United States Patent [19]

Ljungberg

[11] Patent Number: 5,980,988
[45] Date of Patent: Nov. 9, 1999

[54] ALUMINA COATED CUTTING TOOL

[75] Inventor: Björn Ljungberg, Enskede, Sweden

[73] Assignee: Sandvik AB, Sandviken, Sweden

[21] Appl. No.: 08/947,880

[22] Filed: Oct. 9, 1997

Related U.S. Application Data

[62] Division of application No. 08/348,084, Nov. 25, 1994, Pat. No. 5,851,687.

[30] Foreign Application Priority Data

Dec. 23, 1993 [SE] Sweden .................................. 9304283

[51] Int. Cl.$^6$ ..................................................... C23C 16/00
[52] U.S. Cl. ................................ 427/255.19; 427/255.21; 427/255.28

[58] Field of Search ...................................... 427/331, 350, 427/255.19, 255.21, 255.28

Primary Examiner—Timothy Speer
Attorney, Agent, or Firm—Burns, Doane, Swecker & Mathis, L.L.P.

[57] ABSTRACT

A body with a coating comprising one or more refractory layers of which at least one layer is a layer of $\alpha$-$Al_2O_3$ textured in the (110) direction is disclosed. Said alumina layer which is essentially free of cooling cracks, comprises platelike grains with a length of 2–8 $\mu$m and a length/width ratio of 1–10, preferably 3–7. The coated tools according to the presently claimed invention show improved tool lives compared to prior art tools when used for machining steel or cast iron material.

14 Claims, 2 Drawing Sheets

ALUMINA COATED CUTTING TOOL

This application is a divisional of application Ser. No. 08/348,084, filed Nov. 25, 1994 now U.S. Pat. No. 5,851,687.

BACKGROUND OF THE INVENTION

The presently claimed invention relates to an alumina coated cutting tool for chipforming machining.

Chemical Vapor Deposition (CVD) of alumina on cutting tools has been an industrial practice for more than 15 years. The wear properties of $Al_2O_3$ as well as of other refractory materials have been discussed extensively in the literature.

The CVD-technique has also been used to produce coatings of other metal oxides, carbides and nitrides, the metal being selected from transition metals of the IVB, VB and VIB groups of the Periodic Table. Many of these compounds have found practical applications as wear resistant or protective coatings, but few have received as much attention as TiC, TiN and $Al_2O_3$.

Cemented carbide cutting tools coated with various types of $Al_2O_3$-coatings, e.g., pure $\kappa$-$AL_2O_3$, mixtures of $\kappa$- and $\alpha$-$Al_2O_3$ and very coarse-grained $\alpha$-$Al_2O_3$ have been commercially available for many years. $Al_2O_3$ crystallizes in several different phases: $\alpha$, $\kappa$, $\gamma$, $\beta$, $\theta$, etc. The two most frequently occurring phases in CVD of wear resistant $Al_2O_3$-coatings are the thermodynamically stable, hexagonal $\alpha$-phase and the metastable $\kappa$-phase. Generally, the $\kappa$-phase is fine-grained with a grain size in the range 0.5–2.0 $\mu$m and often exhibits a columnar coating morphology. Furthermore, $\kappa$-$Al_2O_3$ coatings are free from crystallographic defects and free from micropores or voids.

The $\alpha$-$Al_2O_3$ grains are usually coarser with a grain size of 1–6 $\mu$m depending upon the deposition conditions. Porosity and crystallographic defects are in this case more common.

Often, both $\alpha$- and $\kappa$-phase are present in a CVD alumina coating deposited onto a cutting tool. In commercial cutting tools, $Al_2O_3$ is always applied on TiC coated carbide or ceramic substrates (see, e.g., U.S. Pat. No. 3,837,896, now Reissue U.S. Pat. No. 29,420) and therefore the interfacial chemical reactions between the TiC-surface and the alumina coating are of particular importance. In this context, the TiC layer should also be understood to include layers having the formula $TiC_xN_yO_z$ in which the carbon in TiC is completely or partly substituted by oxygen and/or nitrogen.

The practice of coating cemented carbide cutting tools with oxides to further increase their wear resistance is in itself well-known as is evidenced in e.g., U.S. Pat. Reissue No. 29,420 and U.S. Pat. Nos. 4,399,168; 4,018,631; 4,490,191 and 4,463,033. These patents disclose oxide coated bodies and how different pretreatments, e.g., of TiC-coated cemented carbide, enhance the adherence of the subsequently deposited oxide layer. Alumina coated bodies are further disclosed in U.S. Pat. Nos. 3,736,107; 5,071,696 and 5,137,774 wherein the $Al_2O_3$ layers comprise $\alpha$, $\kappa$ and respective $\alpha$+$\kappa$ combinations.

U.S. Pat. No. 4,619,866 describes a method for producing fast growing $Al_2O_3$ layers by utilizing a hydrolysis reaction of a metal halide under the influence of a dopant selected from the groups consisting of sulphur, selenium, tellurium, phosphorous, arsenic, antimony, bismuth and mixtures thereof. A few examples of sulphur-based dopants are $H_2S$, COS, $CS_2$, $SF_6$, $SF_4$, $SO_2Cl_2$ and $SO_2$. Under these process conditions, essentially two phases of $Al_2O_3$, the $\alpha$- and $\kappa$-phases, are produced. The resulting coating consists of a mixture of the smaller $\kappa$-grains and the larger $\alpha$-grains. The process yields coatings with an even layer thickness distribution around the coated body.

U.S. Ser. No. 08/238,341 (our reference: 024000-881) discloses a method of growing a fine-grained $\kappa$-alumina coated.

U.S. Ser. No. 08/159,217 (our reference: 024000-993) discloses a method for obtaining a fine-grained, (012)-textured a-$Al_2O_3$coating. This particular $Al_2O_3$-coating applied on cemented carbide tools has been found particularly useful for cast-iron machining.

Due to the difference in thermal expansion coefficient of alumina and a cemented carbide substrate, cooling cracks, forming an interconnected network, are frequently present in an $Al_2O_3$-coating, see, e.g., U.S. Pat. No. 5,123,934, FIG. 4 herein. During certain cutting operations with $Al_2O_3$-coated tools, the cooling cracks propagate into the cemented carbide substrate and cause premature tool failure. The cooling cracks may also initiate spot-wise flaking of the entire coating structure.

OBJECTS AND SUMMARY OF THE INVENTION

It is an object of this invention to avoid or alleviate the problems of the prior art.

The object of the presently claimed invention is, thus, to provide a coated cutting tool insert with an alumina coating essentially free of cooling cracks and as a result with improved cutting performance in steel, stainless steel and cast iron.

It is further an object of this invention to provide onto a hard substrate or preferably onto aforementioned $TiC_xN_yO_z$ coating at least one single phase $Al_2O_3$ layer of the polymorph a with a desired microstructure and crystallographic (110)-texture using suitable nucleation and growth conditions such that said properties of the $Al_2O_3$-layer are stabilized.

In one aspect of the invention there is provided a body with a <20 $\mu$m thick coating including at least one layer of alumina with a thickness of 1–10 $\mu$m, said body having a thermal expansion coefficient between 4 and 7 ●$10^{-6}K^{-1}$, said alumina layer being essentially free of cooling cracks.

In another aspect of the invention there is provided a method of coating a body with the textured a-alumina coating in which the body is brought in contact with a hydrogen carrier gas containing one or more halides of aluminum and a hydrolyzing and/or oxidizing agent at high temperature wherein the oxidation potential of the CVD reactor atmosphere prior to the nucleation of $Al_2O_3$ is kept at a low level using a total concentration level of $H_2O$ or other oxidizing species preferably below 5 ppm, the nucleation of $Al_2O_3$ is started up by a controlled sequencing of the reactant gases in the following order: $CO_2$, CO and $AlCl_3$, the temperature is about 850° C to 1100° C during the nucleation and during the growth of the $Al_2O_3$ coating a sulphur-fluorine-containing gas mixture is added to the reaction mixture.

DETAILED DESCRIPTION OF THE PREFERRED EMBODIMENTS OF THE INVENTION

According to the presently claimed invention, there is provided a cutting tool comprising a body of a hard alloy onto which a wear resistant coating has been deposited. The coating comprises one or several refractory layers of which at least one layer is a (1 10)-textured $Al_2O_3$-layer of the polymorph a essentially free of cooling cracks.

Figure 1:
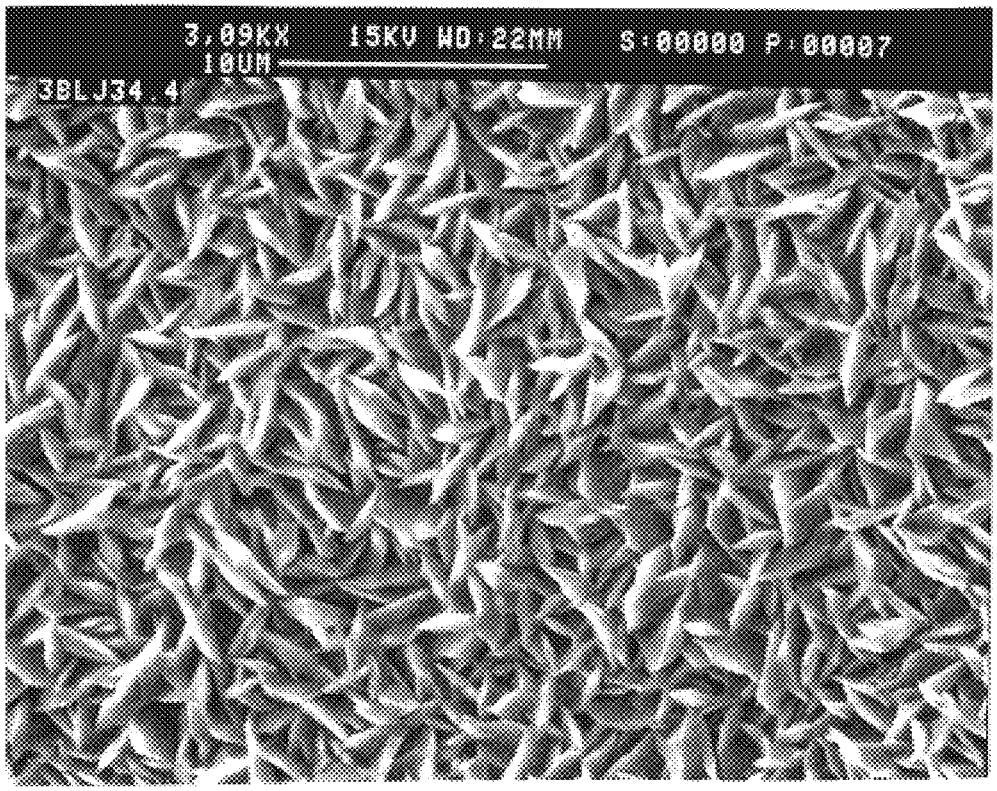
FIGS. 1 and 3 show Scanning Electron Microscope (SEM) top-view micrographs at 3000× magnification of a typical $Al_2O_3$-coating according to the presently claimed invention, FIG. 1, and according to prior art, FIG. 3.
Figure 2:
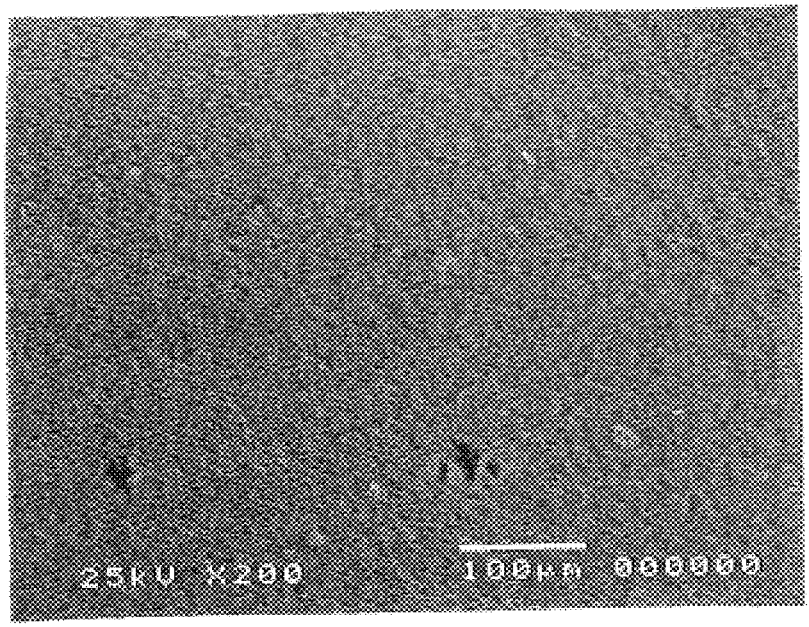
FIGS. 2 and 4 show SEM top-view micrographs at 200× magnification of an $Al_2O_3$-coating according to the presently claimed invention, FIG. 2, and according to prior art, FIG. 4.
Figure 3:
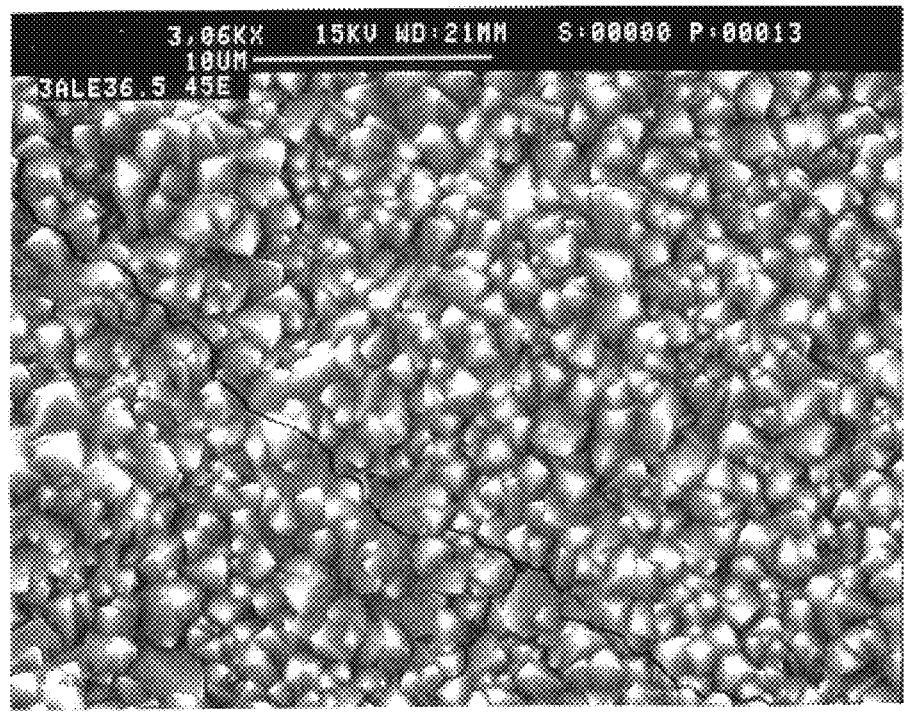
Figure 4:
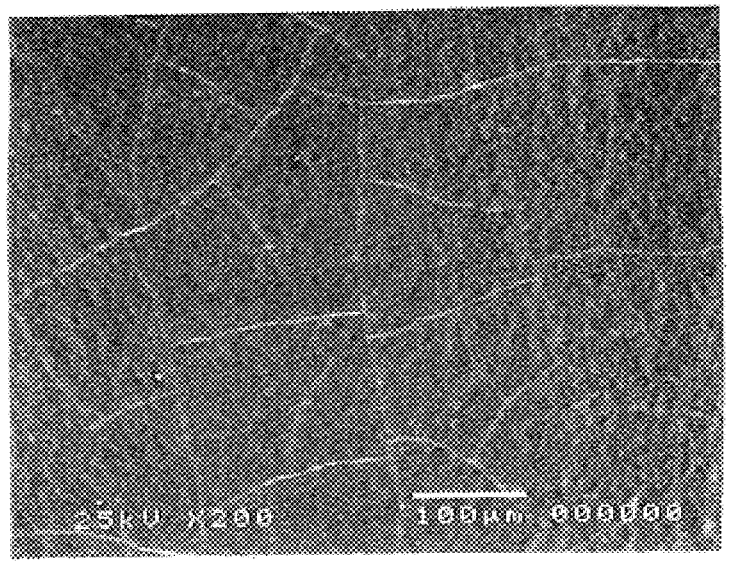

Surprisingly, a method has been found to grow an $\alpha$-$Al_2O_3$ coating with a specific microstructure and a crystallographic texture that essentially reduces not only the number of cooling cracks but also the length and the width of each individual cooling crack. The cooling cracks are isolated and they do not form an interconnected network (compare FIG. 2 and FIG. 4). Cemented carbide tools coated with such $Al_2O_3$-layers show improved tool lives compared to prior art tools when used for machining steel or cast iron, particularly if the surface of the insert has been further smoothed by wet blasting.

More specifically, the presently claimed invention relates to a coated body with a thermal expansion coefficient of between 4 and 7 $\bullet 10^{-6} K^{-1}$, provided with a <20 $\mu$m thick coating including at least one layer of alumina with a thickness of 1–10 $\mu$m and being essentially free of cooling cracks.

Preferably, said body is a cutting tool insert of a cemented carbide, titanium-based carbonitride and/or ceramic.

Preferably, the $Al_2O_3$-layer according to the presently claimed invention, has a preferred crystal growth orientation in the (110)-direction which is determined by X-ray Diffraction (XRD) measurements. A Texture Coefficient (TC) can be defined as:

$$TC(hkl) = \frac{I(hkl)}{I_o(hkl)} \left\{ \frac{1}{n} \sum \frac{I(hkl)}{I_o(hkl)} \right\}^{-1}$$

where

I(hkl) = measured intensity of the (hkl) reflection $I_o$(hkl) = standard intensity of the ASTM standard powder pattern diffraction data n = number of reflections used in the calculation, (hkl) reflections used are: (012), (104), (110), (113), (024), (116)

According to the presently claimed invention, TC for the set of (110)-crystal planes is larger than 1.5, preferably larger than 2.5, and most preferably larger than 3.5.

The size of the $Al_2O_3$-grains varies dependent upon the nucleation and growth conditions used. The average grain size is determined from a SEM top-view micrograph at 5000x magnification. For at least ten randomly picked $Al_2O_3$-grains, the length (L) and the width (W) as seen from top-view are measured. The average L and average W represent the actual grain size. For coatings according to the presently claimed invention, the L/W ratio is 1–10, preferably 3–7, with L=2–8 $\mu$m.

In addition to the alumina layer(s), the coating structure comprises TiC or a related carbide, nitride, carbonitride, oxycarbide and oxycarbonitride of a metal selected from the group consisting of metals in the Groups IVB, VB and VIB of the Periodic Table, B, Al and Si and/or mixtures thereof, $TiC_xN_yO_z$ (as defined before) being preferred.

In a preferred embodiment, the alumina layer according to the presently claimed invention is preferably the outermost layer but there may also be deposited on top of it one or more further layers.

In yet another preferred embodiment, said alumina layer is in contact with a $TiC_xN_yO_z$-layer which preferably is the innermost layer of the coating.

The textured $Al_2O_3$-coating according to the presently claimed invention is obtained by careful control of the oxidation potential of the CVD reactor atmosphere prior to the nucleation of $Al_2O_3$. The total concentration level of $H_2O$ or other oxidizing species should preferably be below 5 ppm. However, the nucleation of $Al_2O_3$ is initiated by a controlled sequencing of the reactant gases, i.e., the gases enter the reactor in the following order: $CO_2$, CO and $AlCl_3$ and the temperature is within the range of from about 850° C to 1100° C, preferably about 1000° C to 1050° C. Used nucleation conditions determine the alumina polymorph, the alumina grain size and to a certain extent the desired texture. During the deposition process, a sulphur-flourine-containing gas mixture is added to the reaction mixture, preferably $SF_6$, in order to obtain the desired coating microstructure. Some other possible additives are: $H_2S+F_2$, $H_2S+HF$, $SF_4$, $CF_4+H_2S$, etc. However, the exact conditions depend to a certain extent on the design of the equipment being used. It is within the purview of the skilled artisan to determine whether the requisite texture and coating morphology have been obtained and to modify nucleation and the deposition conditions in accordance with the present specification, if desired, to affect the degree of texture and coating morphology.

The invention is additionally illustrated in connection with the following Examples which are to be considered as illustrative of the presently claimed invention. It should be understood, however, that the invention is not limited to the specific details of the Examples.

EXAMPLE 1

A) Cemented carbide cutting inserts with a thermal expansion coefficient of 6.3 $\bullet 10^{-6} K^{-1}$ and with the composition 6.5% Co, 8.5% cubic carbides and balance WC were coated with a 5.5 $\mu$m thick layer of TiCN. In subsequent process steps during the same coating cycle, a 6.5 $\mu$m thick layer of $\alpha$-$Al_2O_3$ was deposited. The oxidation potential of the hydrogen carrier gas, i.e., the water vapor concentration, was explicitly set forth to a low level, less than 5 ppm, prior to the $Al_2O_3$-nucleation (see also U.S. Pat. No. 5,071,696).

A reaction gas mixture comprising $CO_2$, CO, and $AlCl_3$ was sequentially added to the hydrogen carrier gas in given order.

The gas mixtures and other process conditions during the $Al_2O_3$ deposition steps comprised:

| Step | 1 | 2 |
|---|---|---|
| $CO_2$ | 4% | 4% |
| $AlCl_3$ | 4% | 4% |
| CO | 2% | — |
| $SF_6$ | — | 0.2% |
| HCl | 1% | 4% |
| $H_2$ | balance | balance |
| Pressure | 55 mbar | 100 mbar |
| Temperature | 1000° C. | 1030° C. |
| Duration | 1 hour | 5.5 hours |

XRD-analysis showed a texture coefficient, TC(110), of 4.5 of the (110)-planes in the single a phase of the $Al_2O_3$ coating.

SEM-studies showed that the essentially crack free $\alpha$-$Al_2O_3$ coating consisted of plate-like grains with an average grain size of L =3.5 μm and W =0.7 μm. However, the very few occurring cracks had a crack width of approximately 0.01 μm and an average length of about 20 μm.

B) The cemented carbide substrate of A) was coated with TiCN (5.5 μm) and $Al_2O_3$ (6.5 μm) as set forth in A) except for the $Al_2O_3$ process was carried out according to prior art technique resulting in a mixture of coarse α- and fine κ-$Al_2O_3$ grains in the coating. The coating showed a well-developed crack pattern with an average crack distance of 100 μm and a crack width of approximately 0.05 μm.

Coated tool inserts from A) and B) were all wet blasted with 150 mesh $Al_2O_3$ powder in order to smooth the coating surface.

The cutting inserts were then tested with respect to edge line and rake face flaking in a facing operation in nodular cast iron (AISI 60 18, DIN GGG40). The shape of the machined work piece was such that the cutting edge is intermitted twice during each revolution.

Cutting data:

Speed =150 m/min.

Cutting depth =2.0 mm

Feed =0.1 mm/rev.

The inserts were run one cut over the face of the work piece.

The results are expressed in the table below as percentage of the edge line in cut that obtained flaking as well as the rake face area subjected to flaking in relation to total contact area between the rake face and the work piece chip.

|  | Flaking (%) | |
| --- | --- | --- |
|  | Edge Line | Rake Face |
| A) single phase/textured α-$Al_2O_3$ | 0 | 0 (according to the invention) |
| B) α + κ $Al_2O_3$ | 45 | 8 |

EXAMPLE 2

The cutting inserts from A) and B) were also tested with respect to edge line flaking in a facing operation in an alloyed steel (AISI 1518, W-no. 1,0580). The shape of the machined work piece was such that the cutting edge is intermitted three times during each revolution.

Cutting data:

Speed =130–222 m/min.

Cutting Depth =2 mm

Feed =0.2 mm/rev.

The inserts were run one cut over the face of the work piece.

The result below is expressed as percentage of the edge-line in cut that obtained flaking.

|  | Flaking (%) Edge Line | |
| --- | --- | --- |
| D) single phase/textured α-$Al_2O_3$ | 0 | (according to the invention) |
| E) α + κ $Al_2O_3$ | 35 | |

The principles, preferred embodiments and modes of operation of the presently claimed invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A method of coating a body with a textured α-alumina coating, the coating being ≦20 μm thick and including at least one layer of alumina with a thickness of 1–10 μm, the coating having a thermal expansion coefficient between 4 and $7 \cdot 10^{-6} K^{-1}$ and being essentially free of cooling cracks, the method comprising bringing the body in contact with a hydrogen carrier gas containing one or more halides of aluminum and a hydrolyzing and/or oxidizing agent at high temperature wherein the oxidation potential of the CVD reactor atmosphere prior to the nucleation of $Al_2O_3$ is kept at a low level, the nucleation of $Al_2O_3$ being started up by a controlled sequencing of the reactant gases in the following order: $CO_2$, CO and $AlCl_3$, the temperature being about 850° C. to 1100° C. during the nucleation and during the growth of the $Al_2O_3$-coating a sulphur-fluorine-containing gas mixture being added to the reaction mixture.

2. The method of claim 1 wherein said alumina layer comprises single phase a-structure textured in the (110)-direction with a texture coefficient larger than 1.5, the texture coefficient being defined as 4 below:

$$TC(hkl) = \frac{I(hkl)}{I_0(hkl)} \left\{ \frac{1}{n} \sum \frac{I(hkl)}{I_0(hkl)} \right\}^{-1}$$

where

I(hkl) =measured intensity of the (hkl) reflection $I_o$(hkl) =standard intensity of the ASTM standard powder pattern diffraction data n =number of reflections used in the calculation, (hkl) reflections used are: (012), (104), (110), (113), (024), (116).

3. The method of claim 2 wherein the texture coefficient is larger than 2.5.

4. The method of claim 3 wherein the texture coefficient is larger than 3.5.

5. The method of claim 1 wherein said alumina layer comprises platelike grains with a length 2–8 μm and a length/width ratio of 1–10.

6. The method of claim 5 wherein the length/width ratio is 3–7.

7. The method of claim 1 wherein said alumina layer is the outermost layer.

8. The method of claim 1 wherein said alumina layer is in contact with a $TiC_xN_yO_z$-layer.

9. The method of claim 8 wherein the body is coated first with said $TiC_xN_yO_z$-layer.

10. The method according to claim 1 wherein said body is a cutting tool insert of a member taken from the group consisting of cemented carbide, titanium-based carbonitride, ceramics and mixtures thereof.

11. The method of claim 1, wherein the coating is formed such that cooling cracks are isolated and do not form an interconnected network.

12. The method of claim 1, wherein the body comprises a cutting tool.

13. The method of claim 1, wherein the body comprises a cutting tool insert.

14. The method of claim 1, wherein the oxidation potential is kept at a low level by using a total concentration level of $H_2O$ or other oxidizing species preferably below 5 ppm.

* * * * *